(12) United States Patent
Chae

(10) Patent No.: US 10,811,844 B2
(45) Date of Patent: Oct. 20, 2020

(54) EXTERNAL CAVITY LASER USING VERTICAL-CAVITY SURFACE-EMITTING LASER AND SILICON OPTICAL ELEMENT

(71) Applicant: Optella Co., LTD., Gwangju (KR)

(72) Inventor: Chang Joon Chae, Seoul (KR)

(73) Assignee: Cosemi Technologies, inc., Irvine, CA (US)

( * ) Notice: Subject to any disclaimer, the term of this patent is extended or adjusted under 35 U.S.C. 154(b) by 0 days.

(21) Appl. No.: 16/474,034

(22) PCT Filed: Dec. 28, 2016

(86) PCT No.: PCT/KR2016/015361
§ 371 (c)(1),
(2) Date: Jun. 26, 2019

(87) PCT Pub. No.: WO2018/124325
PCT Pub. Date: Jul. 5, 2018

(65) Prior Publication Data
US 2019/0341744 A1 Nov. 7, 2019

(30) Foreign Application Priority Data
Dec. 27, 2016 (KR) .................... 10-2016-0179677

(51) Int. Cl.
*H01S 5/00* (2006.01)
*H01S 5/187* (2006.01)
(Continued)

(52) U.S. Cl.
CPC .............. *H01S 5/187* (2013.01); *H01S 5/028* (2013.01); *H01S 5/0215* (2013.01);
(Continued)

(58) Field of Classification Search
CPC .... H01S 5/18327; H01S 5/0215; H01S 5/028; H01S 5/1014; H01S 5/1092;
(Continued)

(56) References Cited

U.S. PATENT DOCUMENTS 7,492,802 B2    2/2009  Kim et al.
7,580,441 B2    8/2009  Lee et al.
(Continued)

FOREIGN PATENT DOCUMENTS

JP    H11112085 A    4/1999
KR    20060055606 A    5/2006
(Continued)

*Primary Examiner* — Kinam Park
(74) *Attorney, Agent, or Firm* — George Fountain; Loza & Loza LLP

(57) ABSTRACT

Provided is an external cavity laser (ECL) including a vertical cavity surface emitting laser (VCSEL)-Distributed Bragg Reflector (DBR) type light emitting unit configured to receive a current and emit light, and including a DBR function layer and an active layer for a quantum well formed on one side of this DBR function layer, and an optical circuit unit including a light guide in which one end surface is installed to face an active layer at one side of the active layer, light generated from the active layer is received and guided, and an optical axis is formed vertically to an active layer plane, a reflection pattern that is formed at one side of the light guide so as to receive light output from the other end of the light guide to reflect the light again to the light guide, and an external layer for surrounding the light guide and the reflection pattern, wherein the VCSEL-DBR type light emitting unit and the optical circuit unit are mutually coupled to each other. An optical coupling efficiency in the ECL may be raised by improving an inefficient optical coupling issue including alignment, reflection, and the like in a coupling part of a gain element and a silicon waveguide.

9 Claims, 6 Drawing Sheets

(51) Int. Cl.
*H01S 5/02* (2006.01)
*H01S 5/028* (2006.01)
*H01S 5/10* (2006.01)
*H01S 5/183* (2006.01)
*H01S 5/22* (2006.01)
*H01S 5/343* (2006.01)
*H01S 5/14* (2006.01)
*H01S 5/024* (2006.01)

(52) U.S. Cl.
CPC .......... *H01S 5/1014* (2013.01); *H01S 5/1092* (2013.01); *H01S 5/141* (2013.01); *H01S 5/147* (2013.01); *H01S 5/18325* (2013.01); *H01S 5/18327* (2013.01); *H01S 5/18361* (2013.01); *H01S 5/2206* (2013.01); *H01S 5/343* (2013.01); *H01S 5/02469* (2013.01)

(58) Field of Classification Search
CPC ............. H01S 5/18325; H01S 5/18361; H01S 5/2206; H01S 5/343; H01S 5/02469; H01S 5/141; H01S 5/147; H01S 5/187
See application file for complete search history.

(56) References Cited

U.S. PATENT DOCUMENTS

| | | | |
|---|---|---|---|
| 2004/0013154 A1* | 1/2004 | Zheng | H01S 5/18383 372/96 |
| 2004/0131102 A1 | 7/2004 | Jette et al. | |
| 2004/0202218 A1* | 10/2004 | Thornton | H01S 3/06716 372/50.1 |
| 2006/0029120 A1* | 2/2006 | Mooradian | H01S 5/141 372/102 |
| 2006/0104322 A1* | 5/2006 | Park | G02B 5/26 372/34 |
| 2015/0364899 A1* | 12/2015 | Tatah | H01S 5/141 372/20 |
| 2016/0134083 A1* | 5/2016 | Dallesasse | H01S 5/18333 372/50.11 |

FOREIGN PATENT DOCUMENTS

| | | |
|---|---|---|
| KR | 20070104504 A | 10/2007 |
| KR | 101100433 B1 | 12/2011 |

* cited by examiner

EXTERNAL CAVITY LASER USING VERTICAL-CAVITY SURFACE-EMITTING LASER AND SILICON OPTICAL ELEMENT

CROSS-REFERENCE TO RELATED APPLICATIONS

This application is the U.S. National Stage of International Patent Application No. PCT/KR2016/015361 filed on Dec. 28, 2016, which claims the benefit of priority from KR Patent Application No. 10-2016-0179677 filed Dec. 27, 2016, the disclosures of the foregoing applications being incorporated herein by reference in their entirety for all applicable purposes.

TECHNICAL FIELD

The present invention relates to an external cavity laser (ECL), and more particularly, to an external cavity layer obtained by coupling an optical circuit unit obtained by forming an optical element on a silicon substrate and a light emitting unit obtained by forming a gain element on a material substrate having a direct band gap.

BACKGROUND ART

A semiconductor laser developed in early 1960s by Alferov and Kreoemer, etc., was successfully operated in a room temperature in 1970, and thereby accelerating its commercialization. The room temperature operation of the semiconductor laser is performed by effectively confining a current and light with a double heterostructure.

In 1980s, a more efficient laser with a low threshold current could be fabricated by reducing a density of state, using a quantum well structure. As an extension of this, in 1990s, an energy band structure was made more idealistic with a strained quantum well, and accordingly, the density of state could be further lowered and better laser characteristics could be obtained.

The concept of one-dimensional quantum well has been extended to two dimensional one (quantum wire) and three dimensional one (quantum dot), and recently fabrication and oscillation of a quantum dot laser has been reported. It is known that the quantum dot laser theoretically has a very low oscillation threshold current and very high quantum efficiency.

The heterostructure is composed by laminating and coupling a ternary or quaternary compound semiconductor having an identical lattice constant with a binary compound semiconductor such as GaAs as a substrate. For group III-V compound semiconductor, a ternary or quaternary compound having various band gaps may be grown on a gallium arsenide (GaAs) or indium phosphide (InP) substrate. The double heterostructure (DH) has optical waveguide characteristics when viewed from an optical viewpoint. This is because since a compound semiconductor with a small band gap has a typically large refractive index, the compound semiconductor simultaneously performs a light emission function due to electron-hole recombination, and a role of a waveguide on light generated in this process.

Meanwhile, a technology is called as silicon optics, in which a plurality of optical elements are fabricated on a silicon substrate using a semiconductor fabrication process, and an integrated optical circuit having a specific optical function is configured using those optical elements and is utilized in various ways.

This silicon optic technology is being mainly applied to an optical transmission/reception module to be used in an optical interconnection for connecting communication devices or communication process-dedicated boards to each other in a large-scale data center.

Meanwhile, a large number of laser light sources are used in an optical transmission/reception module, but an individual light source such as a vertical cavity surface emitting laser (VCSEL) using 850 nm wavelength light is widely used in a currently commercialized module. However, it is expected that the wavelength band of the light source will be shortly moved to a 1.3 μm band due to technical requests such as elongating a transmission distance, increasing a transmission capacity, and performing high integration.

In addition, as a light source of a 1.3 μm band, a laser such as a VCSEL or a distributed feedback (DFB) laser may be used as an individual element, but for a high speed and large-scale optical transmission module, an optical transmission module to which a silicon optical technology is applied will be expected to be used in a next generation product in consideration of issues of heat generation, price, power consumption, or the like. Therefore, many researches are currently performed on the optical transmission module to which the silicon optical technology is applied.

Silicon is not such a direct band gap material that is requested in efficient emission, and thus, in order to make a laser light source, a group III-V semiconductor such as indium phosphide (InP) is necessary. Accordingly, a scheme is adopted in which a photonic integrated circuit (PIC) including a reflector is fabricated on a silicon substrate, and then is coupled with an InP-based gain element to obtain an ECL.

Implementation of an ECL light source requires two core technologies. One is a technology in which when an InP-based gain element is coupled to a silicon waveguide, optical power is efficiently delivered while a connection loss and a reflection ratio are minimized, and another is a technology about a method for causing optical reflection to occur on a silicon waveguide with a sub-micron width equal or smaller than 0.5 μm. Using these technologies, a reflection ratio and a reflection bandwidth may be implemented in a desired manner.

For a technology related to the coupling of a gain element and a silicon waveguide, a unique technology developed and currently commercialized is a heterogeneous substrate bonding scheme in which a group III-V semiconductor substrate and a silicon-insulator (SOI) substrate used for fabricating a silicon optical element are bonded for each substrate unit, and then a laser light source is implemented using patterning and etching processes, which are nearly identical to a typical semiconductor laser process. Currently Intel™ is a leading developer in this field.

In this double substrate bonding manner, an optical coupling efficiency between the laser and the silicon waveguide is very low, and since only a fraction of III-V semiconductor substrate is used, a loss is very large and a yield is also low in terms of a material. Furthermore, the length is long and generated heat is easily delivered to a silicon optical element, which result an increase in unit cost in terms of an optical connection module.

The next technology reaching the commercialization level is to form an ECL by boning a reflective semiconductor optical amplifier (RSOA), which is a kind of an optical amplifier as shown in FIGS. 2 and 3, with a silicon waveguide in which a reflector is implemented. This is being actively developed in leading laboratories and universities in Japan, US, and Europe.

Since an RSOA scheme is applicable only to a required site, there is a little loss of a material and a yield is theoretically relatively high in comparison to the substrate coupling scheme. In addition, the silicon waveguide is expected to be evolved into a silicon PIC, and in this case, when an RSOA is bonded to one corner of the PIC, it is advantageous in that generated heat may be easily treated, thereby reducing an influence to the silicon PIC and improving the level of integration.

However, since the bonding of the RSOA to the silicon waveguide should be performed with an accuracy of 100 nm, a packing process is picky and there is a difficulty in mass production by means of automation. Accordingly, it is disadvantageous in that a unit cost is not easily decreased. Another large issue is that it is difficult to meet a performance condition required as a data center, since power consumption and heat generation amounts are larger than those of a VCSEL.

Next, although not in a commercialized level, one of schemes being actively developed in a laboratory level is a scheme in which, as shown in FIG. 4, a grating coupler (GC), for which vertical bonding is possible in an optical manner, is installed in a silicon PIC and a VCSEL is bonded thereto so as to implement an ECL.

Since the size of the GC is about 12 μm×12 μm, and the diameter of an output surface of a single mode VCSEL is about 9 μm, there is possibility that bonding is easily performed to theoretically highly increase a yield. In addition, since the VCSEL is massively producible in comparison to the RSOA, the price is relatively low and thus a unit cost may be greatly reduced.

However, a manner in which a VCSEL and a GC are bonded has various issues in terms of optics. First, the GC should receive light completely vertically from an IP-based gain element to propagate the light to a silicon optical waveguide, which results a difficulty in that a light propagation direction is required to be abruptly rotated by 90 degrees. Since a typical GC may only relatively efficiently propagate light incident obliquely with a slope of about 7 to 9 degrees, t is very difficult to solve this slope issue in a current semiconductor process. When the light from the silicon waveguide is propagated through the GC to the InP-based gain element, the intensity of the light is not distributed uniformly on a bonded surface of the GC and thus the oscillation characteristics of the ECL may be lowered. This may cause a large optical loss at a coupled part between the VCSEL and the GC, and an increase in power consumption.

Another issue is that a GC operates as a kind of a reflector to make several resonance circuits in an ECL, which results wavelength instability to a laser. This means that it is difficult to secure a light source of a desired wavelength.

A typical GC theoretically has a bonding efficiency of maximum 50%, but actually, it is nearly impossible to implement such a bonding efficiency. In order to obtain a high efficiency, a complex process should be performed on a silicon optical element, and in this case, the cost increases and application of the standard CMOS process may be impossible.

In addition to the above-described issues related to the optical bonding efficiency according to the bonding between the gain element and the silicon PIC, for an optical reflector part in the silicon PIC, most of light sources of the ECL adopts a distributed Bragg reflector (DBR) as a reflector. Since the DBR selects and reflects a specific wavelength, it is suitable to fabricate a laser light source of which wavelength is fixed. However, the length thereof is up to several mm and may impede integration. There is also a limitation in use, since variation in wavelength is very limited.

There is a case where a design parameter of the DBR is adjusted to have a reflection band of about 12 nm, and a variable filter of a very small bandwidth is inserted between the gain element and the DBR so as to enable the wavelength to vary. However, in this case, there is an issue that a variable range is limited to the bandwidth of the DBR.

Furthermore, there is another case where an optical loop is formed in a silicon IC to be used as a reflector with an about 100 nm reflection band. However, for miniaturization, the radius of curvature of the optical loop should be small. Accordingly, the yield may be possibly lowered and a DC is required to be separately and precisely fabricated. Since the performance of the reflector depends on a coupling ratio of the DC and light is split into two rays and looped, the reflection characteristics are different from those of a flat reflector. In other words, since a clockwise mode and a counterclockwise mode coexist in the laser, it is difficult to obtain one desired mode and the power consumption may also increase.

To sum up the above described issues of the typical ECL fabrication methods, first, since bonding of an InP-based gain element and a silicon waveguide requires high precision, a fabrication process is complicated and a yield is low.

Second, the typical methods are inefficient in that consumption power is relatively large in comparison with a desired optical output due to an issue of an InP-based gain element itself or an issue of bonding with a silicon waveguide.

Third, due to a limitation in each element, it is difficult to raise the degree of integration using the typical methods.

Fourth, there is a limitation in variation of a wavelength of a light source according to the typical methods, since the bandwidth of a reflector forming an ECL is small.

Fifth, in an optical transmission system that employs coarse wavelength division multiplexing in which a channel interval is 20 nm, a process for integrating a multichannel light source may become complex. It is obvious that the above-described disadvantages or limitations may not be individual ones, but may be closely related to each other.

DISCLOSURE OF THE INVENTION

Technical Problem

The present invention provides an external cavity laser (ECL) having a configuration that improves an inefficient optical coupling issue in alignment and reflection of coupling parts of a gain element and a waveguide in fabricating the ECL.

The present invention also provides an ECL that enables power consumption to be reduced by increasing an optical coupling efficiency, an adverse effect due to heat generation to be reduced, and the degree of integration of optical element in a photonic integrated circuit to be raised.

The present invention also provides an ECL in which wavelength selection of laser light and integration for multiple channels are relatively easy.

Technical Solution

An embodiment of the present invention provides an external cavity laser including:

a vertical cavity surface emitting laser (VCSEL)-Distributed Bragg Reflector (DBR) type light emitting unit configured to receive a current and emit light, and including a first side DBR function layer and an active layer for a quantum well laminated on a second side surface opposite to a first side of the first side DBR function layer; and an external circuit unit including a light guide in which one end surface is installed to face the active layer at the second side of the active layer, light generated from the active layer is received and guided in the one end surface, and an optical axis is formed vertically to a plane formed by the active layer so as to be matched with an optical axis of the light emitting unit, a second side reflection functional pattern (second side DBR functional pattern) formed at a second side of the light guide so as to receive light output from a second end surface of this light guide to reflect the light again to this light guide, and an external layer configured to surround the light guide and the second side DBR functional pattern, wherein the VCSEL-DBR type light emitting unit and the optical circuit unit are characterized by being mutually coupled to each other.

In an embodiment, when an emissive light guide separate from the light guide may be further coupled to the second side of the second side DBR functional pattern, the ECL of the present invention may be used as an optical transmitter and receiver.

In an embodiment, a plurality of Group III-V semiconductor layers that have typically different refractive indices and are distinguishable from each other may be included in a second surface of the active layer in the light emitting unit to function as a spacer layer or a clad layer that utilizes extraction of the laser light in the active layer as in the VCSEL. In particular, in a spacer layer part corresponding to a light emitting region in which light emission is concentrated in the active layer, a light guiding region may be formed which has a larger refractive index than the periphery and enables to serve as a core of an optical fiber, when this spacer layer is formed.

In an embodiment, a substrate for forming a first side DBR function layer of the light emitting unit and the Group III-V semiconductor layer on the active layer may be formed on the basis of Indium phosphide (InP).

In an embodiment, the light guide, emissive light guide, and the second side DBR functional pattern may be formed of silicon, and the external layer may be formed of any one among a silicon oxide film, a silicon nitride film, or a silicon oxide nitride film. Alternatively, instead of silicon, the silicon nitride film, or the silicon oxide nitride film may be used, and in this case, the external layer may be an oxide film or the silicon oxide nitride film.

In an embodiment, on at least one or preferably both of a surface of the light emitting unit and one end surface of the light guide of the optical circuit unit, which are coupled to face each other, an anti-reflection film may be formed, and the configuration of the anti-reflection film may be formed in consideration of a selected laser light wavelength.

In an embodiment, in a surface in which the light emitting unit contacts the light guide, an optical mode, a light emitting region, and a light intensity distribution of the light emitting chip of a VCSEL-DBR type may be preferably made identical to an optical mode of the light guide or the second side DBR functional pattern.

In an embodiment, the light guide may have a part formed of a rectangular tapered pillar in which at least one of the thickness and the width is gradually reduced as it starts from a first side and is away from the light emitting unit, a channel part of a constant thickness and width, and a part in which as it goes away from the light emitting chip, at least one of the thickness and the width extends at a certain central angle to form a fan shape, and the second DBR functional pattern (curved Bragg grating reflector (BGR)) may have one or more circular arc patterns formed separately from the circular arc (or circular arc surface) of a second side end of the fan shape and in parallel at an identical central angle. At this point, the curved BGR is designed on the basis of a large refractive index difference with the external layer, and has a reflection ratio close to 100%, for example, about 90% in a several hundred nm band.

In an embodiment, as shown in FIGS. 5 and 6, the light emitting unit and the optical circuit unit are bonded in which substrates form 90 degrees mutually to each other. In this case, the bonding is performed so that the optical axes based on the laser light are matched each other, ideally, in alignment.

In an embodiment, the optical circuit unit is typically made using a semiconductor-on-insulator (SOI) substrate, and in this case, the light guide and reflection patterns are formed by patterning single crystal silicon, and the patterns may have a state of being buried by a surrounding BOX layer and a silicon oxide layer covering the patterns.

Advantageous Effects

According to the present invention, power consumption may be reduced by increasing an optical coupling efficiency, an adverse effect due to heat generation may be reduced, and the degree of integration of optical elements in a PIC may be increased by improving an inefficient optical coupling issue in alignment and reflection of the coupling parts of a gain element and a silicon waveguide in fabricating the ECL.

According to the present invention, an ECL may be provided in which wavelength selection of laser light and integration for multiple channels are relatively easy.

When using the ECL of the present invention, an optical transmitter and receiver used for optical connection may be massively fabricated in a low cost, the power consumption may be dramatically reduced, and the size of the optical transmitter and receiver may be reduced. In addition, since several light sources may be fabricated at the same time, it is possible to use the ECL for various purposes other than the optical transmitter and receiver.

MODE FOR CARRYING OUT THE INVENTION

A detailed description will be provided through a specific embodiment with reference to the accompanying drawings.

Figure 1:
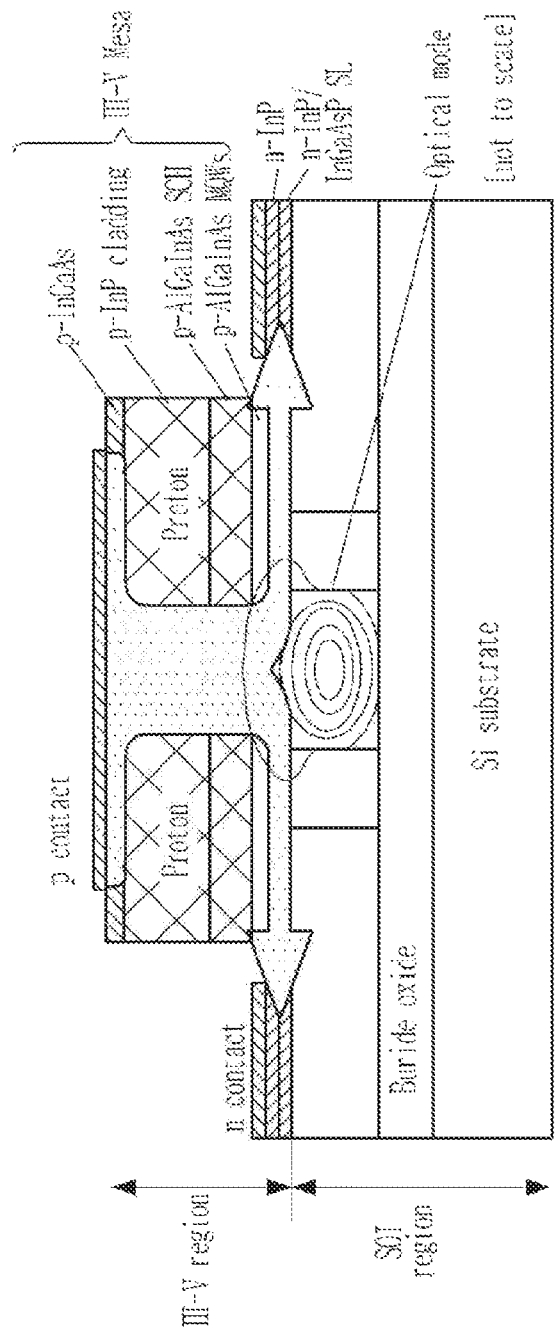
FIG. 1 is a conceptual view illustrating an external cavity laser (ECL) in a heterogeneous substrate bonding manner as an example of a conventional ECL configuration.
Figure 2:
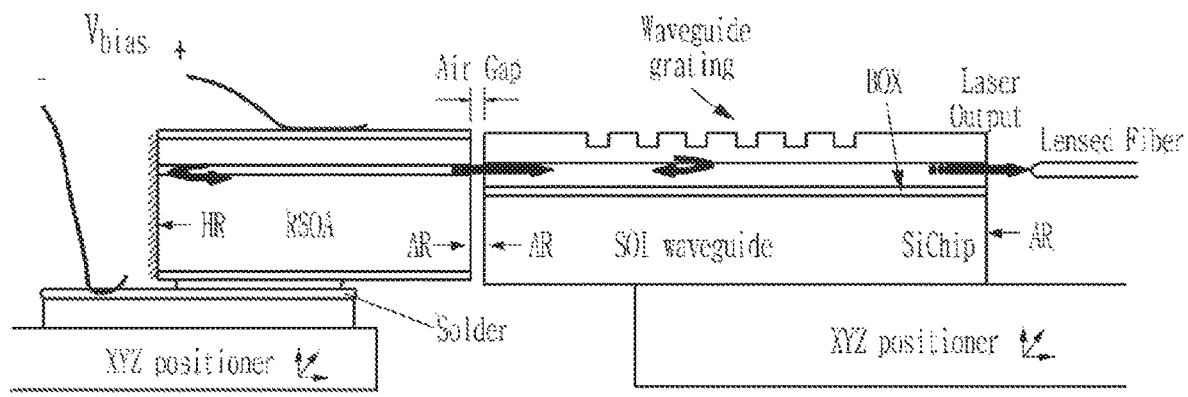
FIGS. 2 and 3 are conceptual views illustrating ECLs formed using a reflective semiconductor optical amplifier (RSOA), as examples of a conventional ECL configuration.
Figure 3:
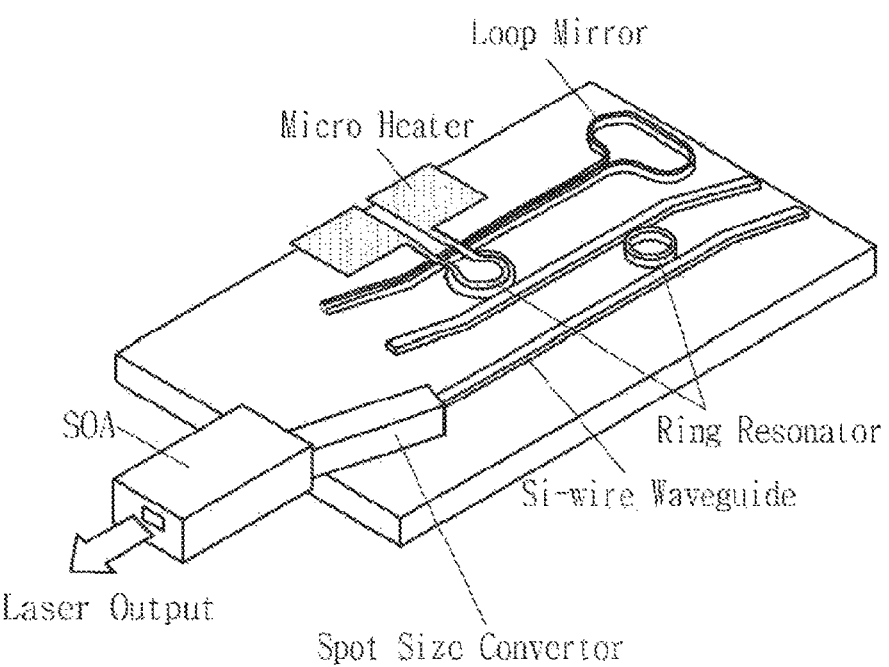
Figure 4:
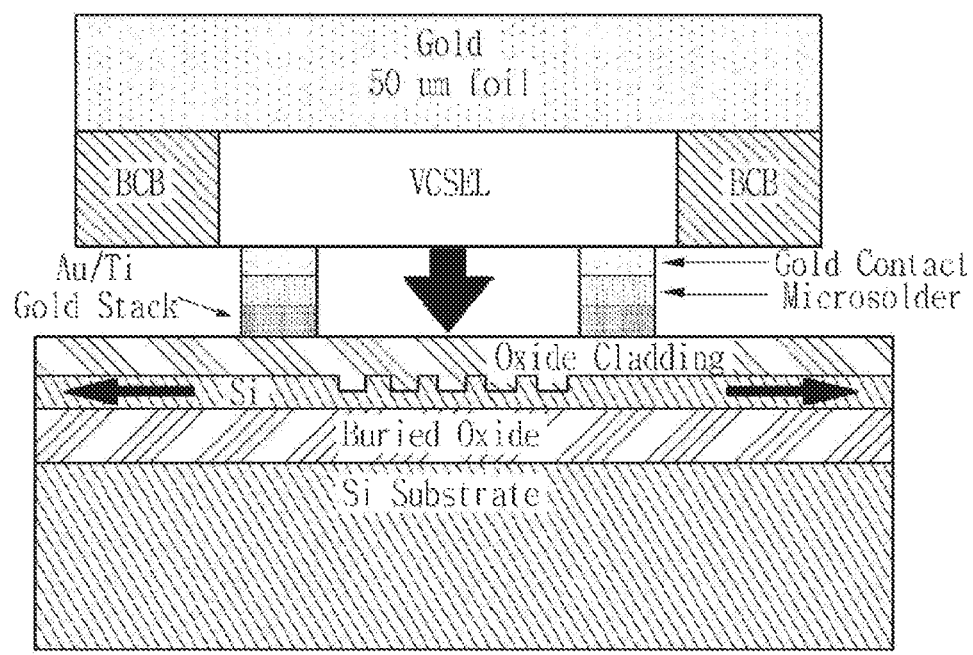
FIG. 4 is a conceptual view illustrating an ECL using a coupling between a vertical cavity surface emitting laser (VCSEL) and a grating coupler (GC) as an example of a conventional ECL configuration.
Figure 5:
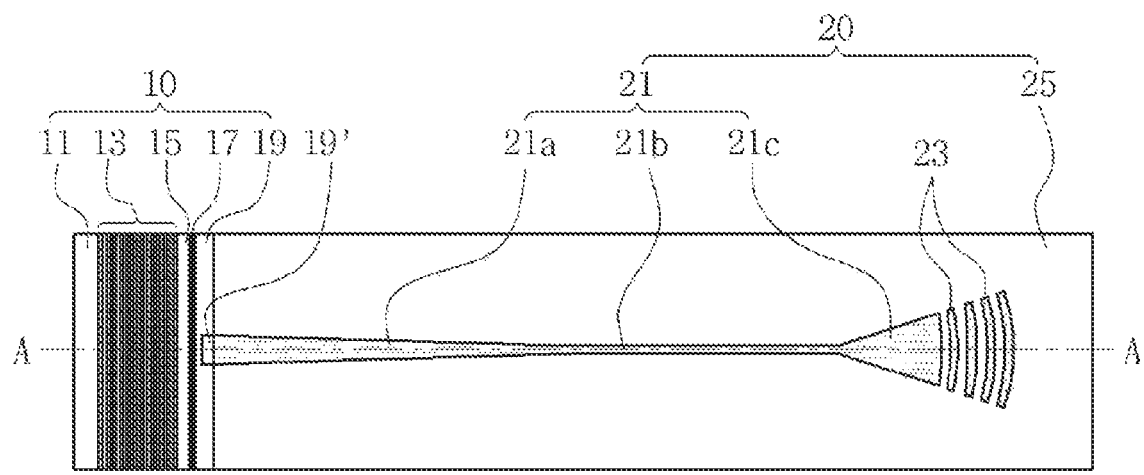
FIG. 5 is a plan view schematically illustrating a basic configuration of an ECL according to an embodiment of the present invention.
Figure 6:
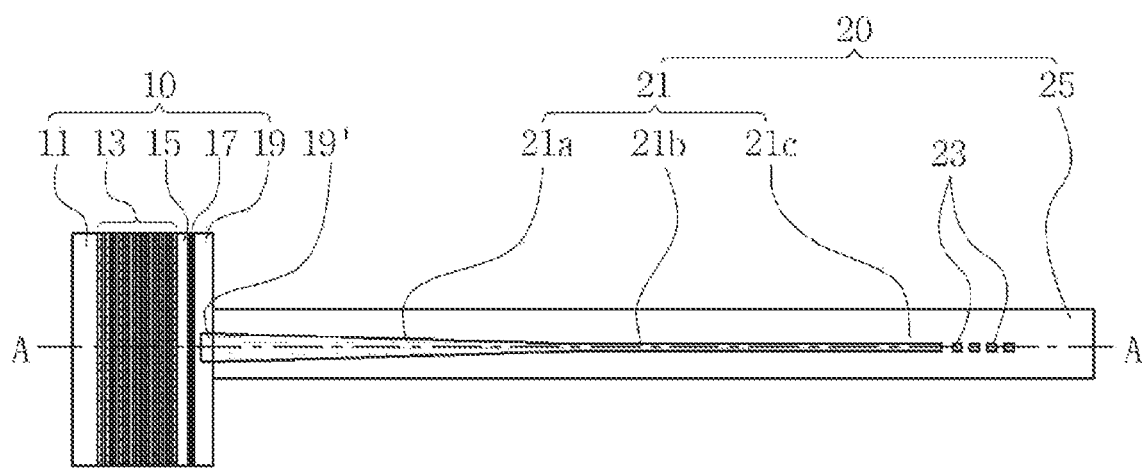
FIG. 6 is a longitudinal sectional view illustrating a section cut along line AA of FIG. 5.

FIGS. 5 and 6 are respectively a plan view and a side view schematically illustrating an external cavity laser (ECL) resonator forming an embodiment of the present invention.

In this embodiment, an ECL is largely divided into a light emitting chip 10 and an optical circuit chip 20.

The light emitting chip 10 is a part for generating laser light, and the optical circuit chip 20 is a part for receiving, guiding and reflecting the laser light. Here, a separate emissive light guide for emitting the laser light to the outside is not shown, and a case where another embodiment has an emissive light guide will be described.

The two parts are separately fabricated with separate substrates adopted as a base. In other words, the light emitting chip 10 is provided in which different Group III-V semiconductor layers are repeatedly laminated on a substrate 11 of an indium phosphide (InP) material. The different Group III-V semiconductor layers may include a binary, ternary, or quaternary compound, and most VCSEL fabrication schemes may be basically applied to fabrication of a light emissive chip, and the specific fabrication method is already well known.

Here, a Distributed Bragg Reflector (DBR) function layer 13 and an active layer 17 for a quantum well are basically provided, and spacer layers or clad layers 15 and 19 are provided in both sides of the active layer 17. In particular, in a part corresponding to a light emitting region in which light emission intensively occurs in the spacer layer 19 that faces the optical circuit chip, a light guiding region 19' is formed in a rectangular pillar shape, which is formed of Group III-V semiconductor layers having a refractive index larger than that of the periphery thereof in the spacer layer.

In more detail, the configuration from the substrate layer, which constitutes a basic configuration, to the active layer may be substantially the same as that of a VCSEL that is a kind of a semiconductor layer typically fabricated in recent days. However, when compared with a conventional VCSEL configuration, an upper DBR function layer, which is to be formed on the active layer, is not formed, and thus it is called as a VCSEL-DBR type in the meaning that the upper DBR function layer, which is a broadband reflector, has been removed from the VCSEL. However, in order to facilitate to emit light, which is generated in the active layer, to an upper part (toward the optical circuit chip), a plurality of Group III-V semiconductor layers of different refractive indices, are further laminated to form the light emitting chip.

In particular, the light guiding region 19' in the rectangular pillar shape is formed with semiconductor layers having refractive indices higher than that of the peripheral region in a part corresponding to an actual light emitting region in the spacer layer 19 of the light emitting chip 10, and is made to correspond to one end surface of the light guide of the optical circuit chip that is to be installed to face thereto. This light guiding region can have a refractive index higher than that of the surrounding semiconductor region, and thus serves to cause the light generated in the active layer to be focused into the light guiding region.

Furthermore, although not clearly illustrated herein, an insulator layer can be formed in the middle of the laminated layers in the peripheral region of the light guiding region so as to cause a current not to flow into the peripheral region, when the current flows through the light emitting chip 10 through electrodes to be installed in a light emitting surface side and a substrate side of the light emitting chip 10. The current mainly flows through the active layer of the light emitting region to cause the light to be intensively emitted in the active layer of this region, and the light may be output from the light emitting chip 10 through the light guiding region 19' to be incident to the light guide of the optical circuit chip.

Here, the chip may be formed by cutting the entire wafer, which is in a state where the entire wafer has the same layer structure, into parts having a required size. In is obvious that, in order to generate light in this light emitting chip, a voltage is to be applied in the laminated direction so as to flow a current, and electrical terminals therefor should be formed. However, it is illustrated that the electrical terminals are omitted in order to simplify the representation.

The light emitting chip10 provided in this way is erected so that a substrate plane is to be a vertical surface in an optical module for the ECL fabrication in this embodiment. Since light emission direction faces a lateral side in the active layer 17, this light emitting chip 10 is similar to a side surface emitting semiconductor laser. However, there is a difference in that an emitting region of a conventional side surface emitting semiconductor laser has only the top and down width of 3 to 4 µm in which the intensity is concentrated onto the active layer with 0.1 to 0.2 µm thickness, while, in the VCSEL type emitting chip of the present invention, since each of top and bottom with and left and right width is about 9 µm, emission is performed with a relatively uniform distribution of the intensity. Accordingly, in the post processing, an optical coupling efficiency can be allowed to be highly maintained without fine setting efforts in alignment with the light guide (waveguide). In addition, since there is a room for alignment in this way, there is little chance to cause a reliability issue such as a functional degradation caused by misalignment, despite of successive minute fluctuations.

In addition, the entire length of a conventional side surface emitting semiconductor laser is very long in comparison to that of the VCSEL emitting chip, which results in difficulty in forming an integrated optical module, in generating massive communication signals, and in removing and processing heat with a heat sink, even though more heat is easily to be generated.

Here, the optical circuit chip 20 may be fabricated using a silicon substrate commonly used in a semiconductor device fabrication process. In particular, for convenience of fabrication of the optical circuit chip 20, it is preferable to use an SOI substrate, and if possible, it is preferable to use a complementary metal-oxide-semiconductor (CMOS) process which is used for manufacturing a general electronic circuit, in order to reduce a fabrication cost and raise a yield.

Forming the light guide 21 and a reflection pattern 23 (a second side DBR function pattern, curved BGR) with an SOI substrate can be performed through a patterning process including mask layer formation, pattern exposure, and etching on the semiconductor process in a state where a silicon layer on an oxide film (BOX) insulation layer of the SOI substrate is formed thinly by polishing. And then, on the light guide 21 and the reflection pattern 23 formed in this way, processes such as lamination, encapsulation and then flattening of silicon oxide films are typically performed.

Here, the BOX and the laminated silicon oxide films is an external layer 25 encapsulating the light guide and the reflection pattern.

The optical circuit chip 20 in this embodiment adopts a silicon layer pattern between the silicon oxide films as the light guide and the reflection pattern. For the light guide and the reflection pattern, since a material of which refractive index is higher than that of a material surrounding them is adoptable, it is also possible that a silicon nitride film or a silicon oxide nitride film having a higher refractive index is used as the pattern layer, and a silicon dioxide film having a lower refractive index is used as the peripheral layer.

The optical circuit chip 20 is bonded and coupled toward an emitting surface (active layer side surface) of the light emitting chip 10 of which one side surface stands vertically in a horizontal state. In the state of being bonded with the light emitting chip, one end of the light guide 21 is exposed on one side surface of the optical circuit chip 20 so as to face the active layer 17. The light guide 21 receives, in one end surface thereof, the light generated in the active layer 17 and guides of, and the optical axis thereof faces a direction vertical to the active layer 17.

The optical circuit chip 20 may be formed in an array of a plurality of repetitive patterns on a silicon wafer with being suitably cut in number. In this case, the light guides that are formed in the chip and have the repetitive patterns may receive the light to serve as a light guide, when bonded into the emitting region of the light emitting chip.

In the present embodiment, the light guide 21 entirely has a horn shape, and, in more detail, is composed of three parts including a tapered part 21a formed of a rectangular tapered pillar of which thickness and width gradually decrease as it starts at the side of the light emitting chip10 and goes away from the light emitting chip10, a channel part 21b formed of a rectangular pillar of which thickness and width are maintained, and a fan-shaped part 21c of which thickness is constant and width extends at a certain angle to form a fan shape, as it goes away from the light emitting chip. The other end surface (end surface of the fan shaped part) of the light guide has a circular arc shape with a constant width in the thickness direction.

For the tapered part 21a formed of the rectangular tapered pillar, a wide side is for making the size similar to that of the emitting region (or guiding region) of the VCSEL-DBR type light emitting chip 10, for receiving a larger amount of light, for making alignment easier, and accordingly for raising the optical coupling efficiency. In the tapered part, the width or the thickness is reduced to make the cross-section area narrower, as it goes to the other side (channel side). This is for matching the cross-section area with that of the channel part 21b in the other end, and in that process, the area is gradually reduced to cause a light loss toward the outside to be smaller.

The width and the thickness of the channel part 21b is for totally raising the degree of circuit integration in the optical circuit chip, and for matching with the size of a typically manufactured optical waveguide for an optical circuit chip.

The fan-shaped part 21c is for preventing a reflection ratio from being lowered in case where light output from a narrow part of the light guide is diffracted, spreads, and then is not sufficiently covered with the reflection pattern 23, when the light guide directly ends at the channel part 21b and the reflection pattern 23 is formed. When the fan-shaped part 21c is continued to the narrow end of the channel part 21b, the diffraction phenomenon in which the light spreads appears, but the fan-shaped part 21c serves to guide the diffracted light within a constant range to thereby reduce a ratio that the light escapes to the outside.

Inversely, when the light radially spreads from the channel part 21b and is reflected by the reflection pattern 23, the fan-shaped part 21c performs a function of collecting and injecting the reflected light to the typical silicon waveguide formed by the channel part 21b, which is similar to the function of the tapered part 21a.

In the other direction of this light guide, the reflection pattern 23 is installed for optical reflection. The role of this reflection pattern 23 may be considered as similar to that of the upper DBR function layer that is omitted in the light emitting chip 10, and thus this may be referred to as a curved Bragg grating reflector (BGR). This reflection pattern 23 may be one or more circular arc patterns with the constant thickness and the constant width formed in parallel having the same central angle while being separated from the circular arc of the fan-shape part of the light guide. This curved BGR is designed on the basis of a large difference in refractive index, and may be designed to have a reflection ratio close to 100%, for example, about 90% in a several hundred nm band.

Bonding of the light emitting chip and the optical circuit chip can be performed through a simple butt bonding, and the bonding surface fixes the chips to be close to each other from the outside, thereby it can be considered that an air gap, which can cause a loss, is little present.

Anti-reflection (AR) films are provided on the surface of the light emitting chip 10 bonded in a face-to-face manner and a wide surface (exposed end surface) of the tapered part 21a of the light guide, which can lower a light loss factor by allowing the light to be maximally transmitted when the light generated from the active layer 17 travels the light emitting chip and the optical circuit chip.

In a view of raising the optical coupling efficiency, the areas through which the light passes and the distributions of the light intensity in the areas are the same or similar in the surface in which the light emitting chip and the optical circuit chip contacts. It is preferable that the ELC of the present invention is designed such that the mode of light output from the VCSEL-DBR type light emitting chip matches the mode of light entering the light emitting chip from the silicon waveguide.

In the above-described embodiment, as shown in FIG. 6, the light emitting chip and the optical circuit chip are bonded to mutually form 90 degrees, and in this case, the bonding is performed to make optical axes based on the laser light be matched and aligned.

In view of an operation of the ECL, when a current is made to flow through an electric terminal of the light emitting chip 10 in the VCSEL-DBR configuration, the light is generated from the active laser QW 17. A part of the light is propagated along the silicon waveguide (light guide) 21 of the optical circuit chip 20 via the guiding region 19'.

The light propagated along the silicon waveguide (light guide) 21 is reflected by the reflection pattern 23 formed of the curved BGR so as to be returned to the active layer. The light returned to the active layer has the energy increased by stimulated emission, and then travels to the DBR function layer 13 behind the active layer 17 of the VCSEL-DBR configuration.

When the light reflected by the DBR function layer 13 passes again through the active layer 17, the light obtains further energy, and then is incident to the light guide 21 again. These processes are repeated, and a part of the energy is lost during the processes. When a certain time is elapsed, the amount of the obtained energy and the amount of the lost energy are the same, and from this time, an oscillation starts as a laser.

A current additionally flowing through the light emitting chip 10 of the VCSEL-DBR configuration is converted into light and the light is emitted to the outside with a plurality of wavelengths. In other words, the ECL laser of the present invention basically operates in a multimode.

Figure 7:
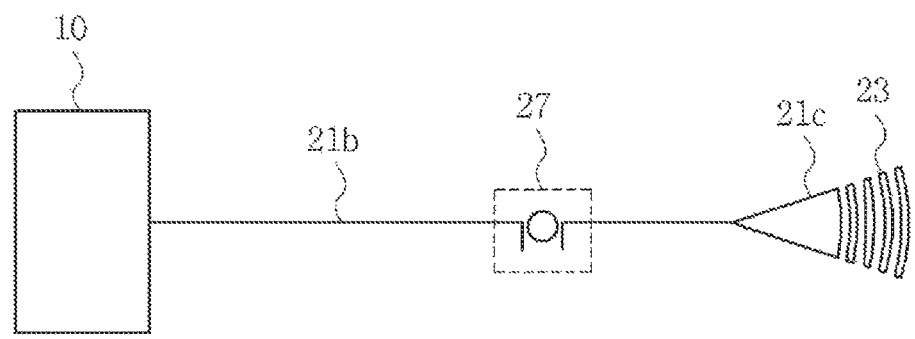
FIG. 7 is a schematic conceptual view illustrating an embodiment in which a variable wavelength filter is coupled to the middle of a light guide in an ECL configuration of the present invention.

FIG. 7 is a plan view schematically illustrating an example in which a variable filter 27 is installed in the middle of the channel part 21b. As shown in FIG. 7, when the variable filter 27, which has a narrow wavelength bandwidth, is installed between the horn type light guide 21 and the curved BGR reflection pattern 23 as in the forgoing embodiment, only one mode is selected and a laser oscillation starts. In other word, the configuration operates in a single mode, and the wavelength is variable. Various kinds of implementations are possible through a known variable wavelength variable filter. Here, when a part of the configuration of the filter is changed or an operation condition is changed, the wavelength band can be changed and the filter can be used as a variable wavelength filter.

In order to assist understanding of the configuration and characteristics of the present invention, the ECL of the present invention will be compared with a conventional ECL.

First, in a manner in which the light emitting chip (InP gain element) is bonded with the optical circuit chip (silicon waveguide), a conventional heterogeneous substrate bonding manner has a structure in which the InP gain element of a Febry-Perot (FP) semiconductor laser shape is mounted on the silicon waveguide, and a line (active layer) of the waveguide, which gives a gain, is parallel to the silicon waveguide. Accordingly, optical lines (traveling direction of the laser light) are apart from each other and in parallel. In a manner according to the present invention, an InP gain element of the VCSEL-DBR configuration, which has a similar structure to the VCSEL structure, is boned with the silicon waveguide to have an angle of 90 degrees, and two optical axes are substantially in alignment. Consequently, it can be understood that the ECL in the conventional heterogeneous substrate bonding manner has a significant difference in structure with the ECL of the present invention.

The conventional RSOA manner may be assumed to be same as the present invention in terms of an optical axis, but the disposition is different. In other words, the RSOA has an FP resonator structure, and is laid down without 90 degree rotation to contact the silicon waveguide for an optical axis matching. The larger difference is in that since the lateral spot size of the RSOA is small, there is a difficulty in axial alignment at the time of boning with the silicon waveguide. On the other hand, the present invention is advantageous in that connection is very easy, since the present invention uses a much wider VCSEL (VCSEL-DBR) emitting area. In addition, the light emitting chip in the present invention is smaller than that of the RSOA, and thus is advantageous in packaging.

A conventional VCSEL/GC manner has the structure in which a VCSEL is mounted on a GC, but the present invention has a manner in which a VCSEL (VCSEL-DBR configuration) contacts the side surface of the silicon waveguide. Both have the same advantage in that the contacting area is wide, but has a significant difference in terms of a bonding efficiency. For the GC, the theoretical maximum efficiency is 50%, but the present invention may have maximum 100%.

For the conventional VCSEL/GC manner, the optical axis is 81 to about 83 degrees, but the present invention is in alignment (0 degree). For the conventional VCEL/GC manner, a modal (optical intensity) distribution is not uniform, but the present invention has a signal mode and a symmetric modal distribution with respect to the central axis.

A reflector used by the conventional manner for forming the ECL is a DFB or an optical loop for a single wavelength or having a bandwidth of 12 nm, whereas the present invention adopts a curved distributed Bragg reflector (DBR) having a large refractive index difference. Accordingly, the ECL in the present invention has a reflection band of several nanometers (nm) (namely, wide reflection band), and can be manufactured to have the size of about several μm.

Figure 8:
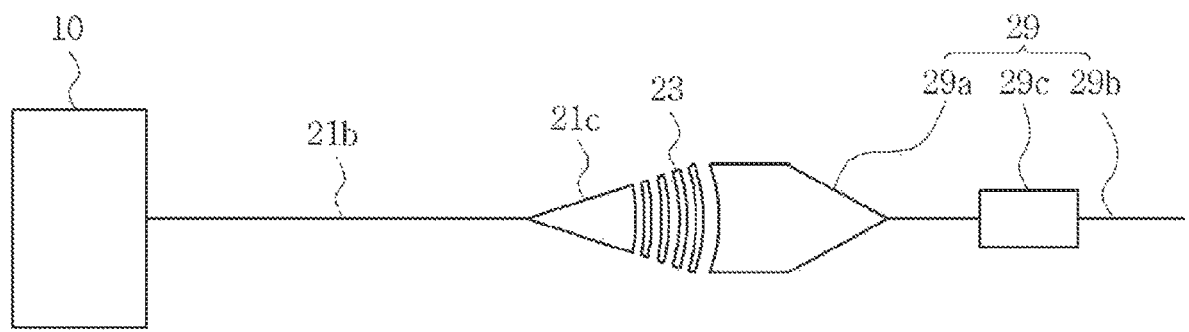
FIG. 8 is a schematic conceptual view illustrating an embodiment in which an emission waveguide is further provided in a rear stage of a reflection pattern of an optical circuit unit in an ECL configuration of the present invention, and is used as an optical transmitter and receiver.

On the other hand, as the embodiment of FIG. 8, when a waveguide 29a that has an end in a shape matched with a circular arc shape of the curved DBR and has a tapered shape with the width being gradually decreased is attached behind the curved DBR reflection pattern 23 as a part of an emissive waveguide 29, most of the light excluding light reflected by the curved DBR (reflection pattern 23) is transmitted and then light in the ECL resonator can be extracted to the outside. The extracted light can be used as signal light of an optical transmitter and receiver via an optical signal modulator 29c in the rear stage.

It is obvious that, as a method for extracting the laser light of the ECL resonator, another conventional method may also be used. For example, the ECL of the present invention may be used as an optical transmitter and receiver by coupling a directional coupler (DC) to the lateral side of the channel part of the light guide and by extracting a part of light passing through the channel part.

Figure 9:
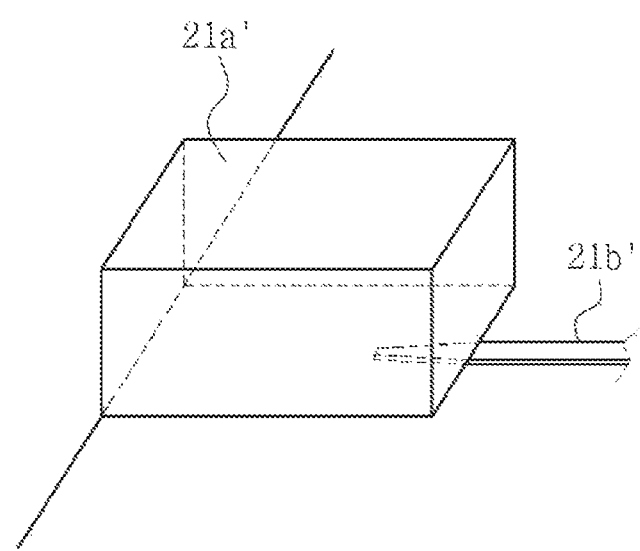
FIG. 9 is a perspective configuration view illustrating an embodiment in which an input stage of the light guide is differently provided in an ECL configuration of the present invention.

FIG. 9 is a perspective view showing a light guide configuration in the ECL resonator of the present invention, which is different from the tapered part forming the light guide in the foregoing embodiments of FIGS. 5 and 6.

Here, the tapered part 21a in the foregoing embodiment, which is at an entrance part of the light guide in the optical circuit chip 10 and is composed of a rectangular tapered pillar, is replaced by a rectangular parallelepiped part 21a' in which the left and right width and the up and down depth extend in comparison to the channel part 21b', and is partially overlapped with the channel part 21b'.

In addition, in the overlap region, the width of the end of the channel part 21b' is made gradually decreased to be sharpened as shown in FIG. 9, or a cut part is formed in the intermediate part thereof.

In this configuration, one end surface of the rectangular parallelepiped part 21a' can be formed with the same thickness and width as those of the end surface of the tapered part 21a of the rectangular tapered pillar in the foregoing embodiment, and thus can be matched with the light guiding region 19' of the light emitting chip to receive the light from the light emitting part. The light incident in this way enters the channel part 21b' in a region overlapping the rectangular parallelepiped part 21a', is propagated to the rear stage through the channel part 21b', and then has the path as in the foregoing embodiment. Meanwhile, the light reflected by the curved BGR (reflection pattern) inversely enters the rectangular parallelepiped part 21a' at the sharpened part, and finally enters the light guiding region 19' of the light emitting chip 10.

The foregoing detailed description of the present invention is provided for the purposes of illustration and understanding, and is not intended to be exhaustive or to limit the present invention to the precise embodiments disclosed.

For example, the foregoing embodiment of FIG. 5 or FIG. 9 shows one of a plurality of types of a light guide of the present invention, but the present invention is not limited thereto.

In addition, the foregoing embodiment shows that one light emitting chip and one optical circuit chip are coupled to form the ECL, but an embodiment of a type in which a plurality of light emitting chips installed in parallel and an optical circuit chip in which a plurality of light guides (waveguides) are formed are coupled, or a type in which an optical circuit chip in which a plurality of light guides are formed in parallel is coupled to a light guiding region formed relatively widely in one light emitting chip is also possible, and this type may be usefully employed in a multi-channel optical transmitter and receiver.

In other words, it will be apparent to those skilled in the art that various modifications and variations can be made on the basis of the present invention, and it Is natural that the modifications and variations fall within the scope of the following claims.

The invention claimed is:

1. An external cavity laser (ECL) comprising:
a vertical cavity surface emitting laser (VCSEL)-Distributed Bragg Reflector (DBR) type light emitting unit configured to receive a voltage and emit light, and comprising a first side DBR function layer and an active layer for a quantum well laminated on a second side surface opposite to a first side of the first side DBR function layer; and
an optical circuit unit comprising a light guide in which one end surface is installed to face the active layer at the second side of the active layer, light generated from the active layer is received and guided in the one end surface, and an optical axis is formed vertically to a plane formed by the active layer, a second side DBR functional pattern (reflection pattern) formed at a second side of the light guide so as to receive light output from a second end surface of the light guide to reflect the light again to the light guide, and an external layer configured to surround the light guide and the second side DBR functional pattern,
wherein the VCSEL-DBR type light emitting unit and the optical circuit unit are characterized by being mutually coupled to each other.

2. The external cavity laser of claim 1, wherein, in the light emitting unit, a Group III-V semiconductor spacer layer is formed on a surface of the active layer, and when the spacer layer is formed, a light guiding region having a larger refractive index than a peripheral region is characterized by being provided in the spacer layer that corresponds to a light emitting region in which light emission is concentrated in the active layer.

3. The external cavity laser of claim 2, wherein a substrate of the light emitting unit and the Group III-V semiconductor space layer are characterized by being manufactured on the basis of Indium phosphide (InP).

4. The external cavity laser of claim 1, wherein the light guide and the second side DBR functional pattern are characterized by being formed of silicon, and the external layer is characterized by being formed of any one among an oxide film, a silicon nitride film, or a silicon oxide nitride film.

5. The external cavity laser of claim 1, wherein an anti-reflection film is characterized by being formed on at least one of the one end surface of the light guide and a surface facing the one end surface.

6. The external cavity laser of claim 1, wherein the light guide comprises:
a tapered part formed of a rectangular tapered pillar in which a width is gradually reduced starting at the one end side and away from the light emitting unit;
a channel part in a rectangular pillar type in which a width is constant; and
a fan-shaped part forming a fan shape with a width extending as being away from the light emitting unit,
wherein the second side DBR functional pattern is characterized by being formed of one or more circular arc patterns that are parallel at an identical central angle and are separated from a circular arc of the fan-shaped part.

7. The external cavity laser of claim 1, wherein a size of the light emitting region of the VCSEL-DBR type light emitting unit and a light intensity distribution in the light emitting region are characterized by being respectively matched with a size and a light intensity distribution of the one end surface.

8. The external cavity laser of claim 1, wherein a wavelength variable filter is characterized by being further installed in a middle of the light guide.

9. The external cavity laser of claim 1, wherein an emissive light guide separate from the light guide is characterized by being further coupled to the second side of the second side DBR functional pattern to be used as an optical transmitter and receiver.

* * * * *

UNITED STATES PATENT AND TRADEMARK OFFICE
CERTIFICATE OF CORRECTION

PATENT NO. : 10,811,844 B2  
APPLICATION NO. : 16/474034  
DATED : October 20, 2020  
INVENTOR(S) : Chang Joon Chae Page 1 of 1

It is certified that error appears in the above-identified patent and that said Letters Patent is hereby corrected as shown below:

On the Title Page

(73) Assignee:  
Delete "Cosemi Technologies, inc., Irvine, CA" and insert --OPTELLA CO., LTD., Gwangju (KR)--

Signed and Sealed this  
Twenty-third Day of March, 2021

Drew Hirshfeld  
*Performing the Functions and Duties of the*  
*Under Secretary of Commerce for Intellectual Property and*  
*Director of the United States Patent and Trademark Office*